（12） United States Patent
Gorin

(10) Patent No.: US 7,035,743 B1
(45) Date of Patent: Apr. 25, 2006

(54) PHASE NOISE COMPENSATION FOR PHASE NOISE MEASUREMENTS

(75) Inventor: Joseph M. Gorin, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/967,772

(22) Filed: Oct. 18, 2004

(51) Int. Cl.
*G01R 13/00* (2006.01)

(52) U.S. Cl. ....................................... 702/69

(58) Field of Classification Search ................. 702/69, 702/76; 324/613, 76.23
See application file for complete search history.

(56) References Cited

U.S. PATENT DOCUMENTS 6,172,564 B1 * 1/2001 Rzyski ........................ 330/149
6,393,372 B1 * 5/2002 Rzyski ........................ 702/111
6,621,277 B1 * 9/2003 Mar ............................ 324/622
2005/0216214 A1 * 9/2005 Gorin et al. .................. 702/76

* cited by examiner

*Primary Examiner*—John Barlow
*Assistant Examiner*—Cindy D. Khuu

(57) ABSTRACT

A system and method compensate for phase noise of a spectrum analyzer when measuring the phase noise of an applied signal based on an established model of the phase noise that accommodates a variety of operating states of the spectrum analyzer. Each operating state has a carrier frequency associated therewith. A frequency offset from the carrier frequency of a designated operating state identifies a frequency range for measuring the phase noise of the applied signal. The model, along with the frequency offset, is used to form an array that is applied to extract an output signal from a phase noise measurement signal that is acquired by the spectrum analyzer.

20 Claims, 4 Drawing Sheets

PHASE NOISE COMPENSATION FOR PHASE NOISE MEASUREMENTS

CROSS-REFERENCE TO RELATED APPLICATIONS

This application is related by subject matter to U.S. Utility Application patent Ser. No. 10/807,205, entitled PHASE NOISE COMPENSATION FOR SPECTRAL MEASUREMENTS, which was filed on Mar. 23, 2004. U.S. Utility Application for patent Ser. No. 10/807,205 is hereby incorporated by reference in its entirety.

BACKGROUND OF THE INVENTION

The performance of spectrum analyzers can be degraded by phase noise that is inherent within the spectrum analyzers. For example, phase noise can reduce measurement accuracy of a spectrum analyzer when the phase noise of the spectrum analyzer cannot be isolated from signal measurements that are performed by the spectrum analyzer. Phase noise can also limit measurement sensitivity of the spectrum analyzer. If the phase noise of the spectrum analyzer is sufficiently high relative to the signals being measured, the signals can be masked by the phase noise and go undetected by the spectrum analyzer. Unfortunately, decreasing the phase noise of the spectrum analyzer to improve the measurement accuracy and measurement sensitivity can be costly or difficult to achieve, due to inherent noise within local oscillators, frequency references and other components of the spectrum analyzers that contribute to phase noise. Accordingly, there is motivation to compensate for the effects of phase noise on the measurements acquired by spectrum analyzers.

One phase noise compensation technique is used in the Option 226 Phase Noise Measurement Personality for the AGILENT TECHNOLOGIES, INC. model E4440A PSA series Spectrum Analyzer. This technique includes characterizing the phase noise of the spectrum analyzer by stimulating the spectrum analyzer with a signal having phase noise that is substantially lower than that of the spectrum analyzer, and then measuring the stimulus signal. The resultant phase noise from the measured stimulus signal is subtracted on a linear power scale from subsequent signal measurements that are performed by the spectrum analyzer. This phase noise characterization pertains only to the one particular operating state of the spectrum analyzer at which the stimulus signal is measured. Therefore, in order to compensate for phase noise using this technique, the characterization is typically performed upon each change of the operating state of the spectrum analyzer, which increases measurement set-up time for the spectrum analyzer.

SUMMARY OF THE INVENTION

Embodiments of the present invention provide a system and method for compensating for phase noise of a spectrum analyzer when measuring the phase noise of an applied signal based on an established model of the phase noise that accommodates a variety of operating states of the spectrum analyzer. Each operating state has a carrier frequency associated therewith. A frequency offset from the carrier frequency of a designated operating state identifies a frequency range for measuring the phase noise of the applied signal. The model, along with the frequency offset, is used to form an array that is applied to extract an output signal from a phase noise measurement signal that is acquired by the spectrum analyzer.

BRIEF DESCRIPTION OF THE DRAWINGS

The disclosed invention will be described with reference to the accompanying drawings, which show exemplary embodiments of the invention and which are incorporated in the specification hereof by reference, wherein.

DETAILED DESCRIPTION OF THE EXEMPLARY EMBODIMENTS

Figure 1:
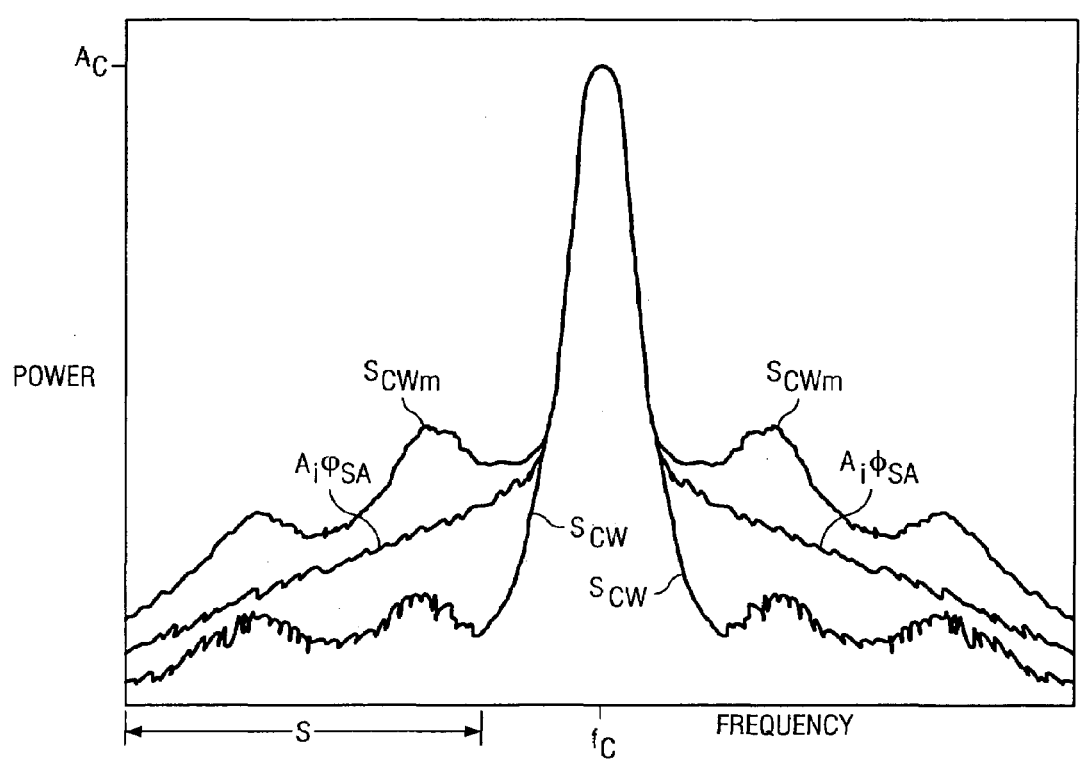
FIG. 1 shows exemplary signals relevant to spectral measurements by a spectrum analyzer.

FIG. 1 shows exemplary signals relevant to spectral measurements acquired by a typical spectrum analyzer. In FIG. 1, a continuous wave signal $S_{CW}$ is shown with a carrier frequency of $f_C$. The carrier frequency $f_C$ has an amplitude $A_C$ corresponding to a peak power of the carrier frequency $f_C$. The continuous wave signal $S_{CW}$ also includes mirror sideband phase noise signals, one of which is within the frequency range denoted S. In applications such as phase noise measurement personality applications, the characteristics of the phase noise signal are of particular importance. For example, the phase noise can be plotted as a function of frequency to determine if the phase noise drop off follows an expected pattern or scale. Typically, in phase noise measurement personality applications, the carrier frequency $f_C$ is not shown on the spectrum analyzer screen, and thus not included within the frequency span of the spectrum analyzer. Using the example shown in FIG. 1, the frequency span of the spectrum analyzer would be set to the frequency span for the phase noise measurement signal S.

FIG. 1 also shows a measured signal $S_{CWm}$ that results when the continuous wave signal $S_{CW}$ is measured by a spectrum analyzer. The spectrum analyzer has a phase noise $\phi_{SA}$ in the operating state at which the continuous wave signal $S_{CW}$ is measured. The measured signal $S_{CW}m$ includes the phase noise $\phi_{SA}$ contributed by the spectrum analyzer. The measured signal $S_{CW}m$ can be expressed as $S_{CW}m = S_{CW} + A_i * \phi_{SA}$, where * indicates multiplication. Thus, the measured signal $S_{CW}m$ can be expressed as the signal $S_{CW}m$ plus the amplitude (power) of the carrier frequency $A_i$ multiplied with the phase noise $\phi_{SA}$ of the spectrum analyzer.

When isolating the phase noise of a signal $S_{IN}$ applied to a typical spectrum analyzer, a phase noise measurement $S_{MEAS}$ acquired by the spectrum analyzer can be expressed as the phase noise of the applied signal $S_{IN}p$ plus the amplitude of the carrier frequency $A_C$ of the applied signal $S_{IN}$ multiplied with the phase noise $\phi_{SA}$ of the spectrum analyzer, as indicated in equation 1.

$$S_{MEAS} = S_{IN}P + A_C * \phi_{SA} \qquad (1)$$

Figure 2:
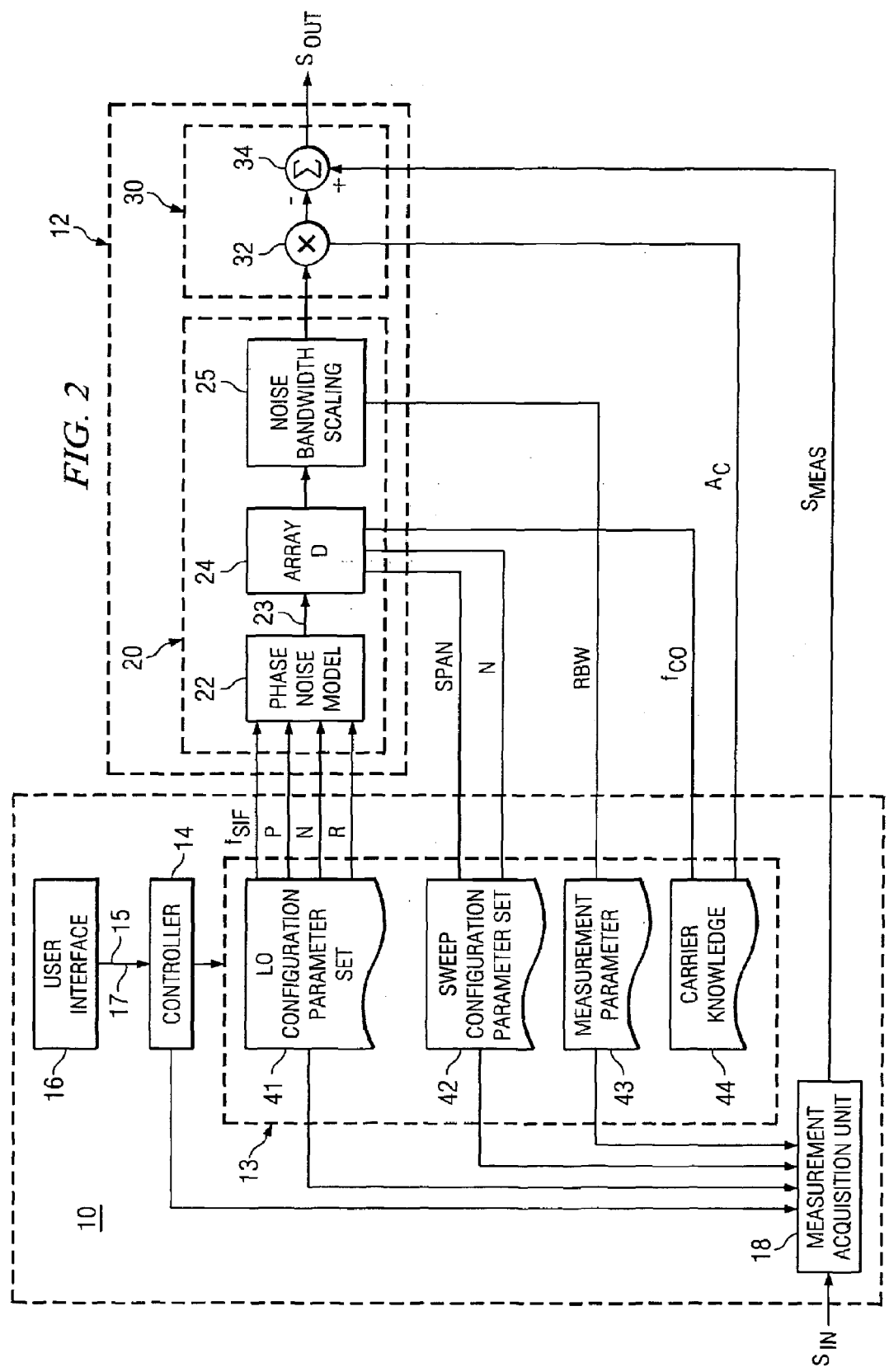
FIG. 2 shows a block diagram of a phase noise compensation system according to embodiments of the present invention.

FIG. 2 shows a spectrum analyzer 10 including a phase noise compensation system 12 in accordance with the embodiments of the present invention. The spectrum analyzer 10 includes a controller 14, typically a computer or other type of processor, that is coupled to a keyboard, touch screen, or other type of user interface 16. The user interface 16 can also be a computer that is coupled to the spectrum analyzer 10 via an interface bus or other communications path 15.

The user interface 16 provides an input 17 to the controller 14, which is used to adjust the operating state of the spectrum analyzer 10. The operating state includes the center frequency CF, the frequency span SPAN, and resolution bandwidth RBW settings for a measurement acquisition unit 18 of the spectrum analyzer 10. However, there may be additional operating states, or operating states that are different from these exemplary operating states, depending on the measurement acquisition unit 18 of the spectrum analyzer 10. The measurement acquisition unit 18 includes the components, elements or subsystems used to characterize the spectral content of signals $S_{IN}$ that are applied to the spectrum analyzer 10.

Figure 3:
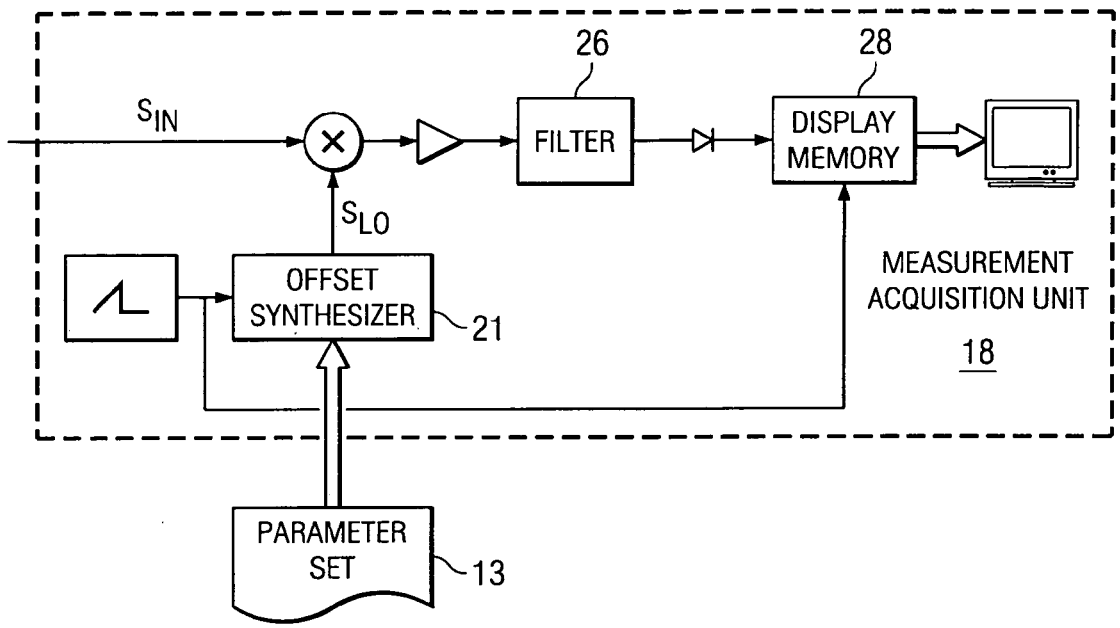
FIG. 3 shows a block diagram of a measurement acquisition unit of a conventional spectrum analyzer.

FIG. 3 shows a simplified block diagram of the measurement acquisition unit 18 of a conventional spectrum analyzer 10, such as an AGILENT TECHNOLOGIES, INC. model E4440 PSA series Spectrum Analyzer, that includes an offset synthesizer 21. The offset synthesizer 21 provides a local oscillator signal $S_{LO}$ that establishes the center frequency CF and frequency span SPAN for the measurements performed by the spectrum analyzer 10. A filter 26 establishes the resolution bandwith RBW for the measurements performed by the spectrum analyzer 10. The operation of a conventional spectrum analyzer is described, for example, in Spectrum Analysis Basics, Application Note 150, provided by AGILENT TECHNOLOGIES, INC., Palo Alto, Calif., USA.

Referring again to FIG. 2, the operating states of the spectrum analyzer 10 are set according to parameters within a designated parameter set 13 associated with the spectrum analyzer 10. The parameters are adjusted, set or otherwise designated via the controller 14 in response to the inputs provided by the user interface 16. Within the parameter set 13 are various categories of parameter sets. For example, the parameter set 13 includes a local oscillator (LO) configuration parameter set 41, a sweep configuration parameter set 42, a measurement parameter set 43 and a carrier knowledge parameter set 44. The LO configuration parameter set 41, sweep configuration parameter set 42 and measurement parameter set 44 are used by the controller 14 to set the measurement acquisition unit 18. The carrier knowledge parameter set 44 includes carrier parameters known by the controller 14, but not used in acquiring $S_{MEAS}$.

An exemplary LO configuration parameter set 41, tabulated in table 1, designates the operating states of a spectrum analyzer 10 that includes an offset synthesizer SYNTH in the measurement acquisition unit 18.

| Parameter | Parameter designation |
|---|---|
| Sampler IF frequency | $f_{SIF}$ |
| Sampler IF polarity | P |
| Sampler harmonic number | N |
| PLL divide ratio | R |

The settings of the LO configuration parameter set 41 that designates the operating state of the spectrum analyzer 10 also influence the phase noise $\phi_{SA}$ of the spectrum analyzer 10. For the parameter set 41 of table 1, the sampler IF frequency (intermediate frequency) $f_{SIF}$, sampler IF polarity P, sampler harmonic number N and PLL (phase lock loop) divide ratio R within the offset synthesizer of the measurement acquisition unit 18 impact the phase noise $\phi_{SA}$ of the spectrum analyzer 10. Thus, when a phase noise measurement is taken of an applied signal $S_{IN}$ by the spectrum analyzer 10, the parameter settings that designate the operating state of the spectrum analyzer 10 for the measurement also establish the phase noise $\phi_{SA}$ that is contributed to the measurement by the spectrum analyzer 10.

The phase noise compensation system 12 shown in FIG. 2 includes a computational unit 20 and signal processor 30. While the computational unit 20 and the signal processor 30 are shown separate from the controller 14, the computational unit 20 and the signal processor 30 are typically implemented within the controller 14. The computational unit 20 forms an array D 24 from a phase noise model $\mathscr{L}(f_{OFFSET})$ 22. The phase noise model $\mathscr{L}(f_{OFFSET})$ 22 represents the phase noise $\phi_{SA}$ of the spectrum analyzer 10 at frequency offsets $f_{OFFSET}$ when the operating state of the spectrum analyzer 10 is set in accordance with the LO configuration parameter set 41. Thus, based on the settings in the LO configuration parameter set 41, the computational unit 20 selects a particular phase noise model $\mathscr{L}(f_{OFFSET})$ 22 that corresponds to the LO configuration parameter set 41.

Once the appropriate phase noise model 22 has been selected, the computational unit 20 selects specific samples from the selected phase noise model 22 based on the frequency span SPAN, a number of measurement points n in $S_{MEAS}$ and a frequency offset $f_{CO}$ from the carrier frequency, which indicates the frequency range between the carrier frequency and an edge frequency on the screen. The frequency offset $f_{CO}$ can be positive or negative, depending on the phase noise sideband signal being measured. The selected samples collectively form the array D 24.

The samples in the array D 24 correspond to the phase noise density in dBc/Hz (the ratio of decibels relative to the carrier power in each hertz of bandwidth). Thus, the samples represent the relative phase noise attributed to the spectrum analyzer 10. However, to remove the effects of the phase noise from the measured signal $S_{MEAS}$, the absolute phase noise of the spectrum analyzer is needed. Therefore, the array D is applied to a noise bandwidth scaling 25 that converts the phase noise array proportional to the noise bandwidth NBW of the spectrum analyzer, established based on the setting of the resolution bandwidth RBW of the spectrum analyzer 10. The noise bandwidth NBW is typically a designated multiple of the resolution bandwidth RBW.

The signal processor 30 applies the array D 24, now in dBc, to a multiplier 32 that multiplies the array D 24 with the power of the carrier frequency $A_C$ to obtain the absolute phase noise of the spectrum analyzer 10. The output of the multiplier 32 is input to a summation unit 34 that applies the phase noise measurements $S_{MEAS}$ of the signal $S_{IN}$ acquired by the measurement acquisition system 18 to the output of multiplier 32 in order to extract an output signal $S_{OUT}$. The output signal $S_{OUT}$ is a representation of the phase noise measurement of signal $S_{IN}$ that includes compensation to reduce the influence of the phase noise $\phi_{SA}$ of the spectrum analyzer 10.

Figure 4:
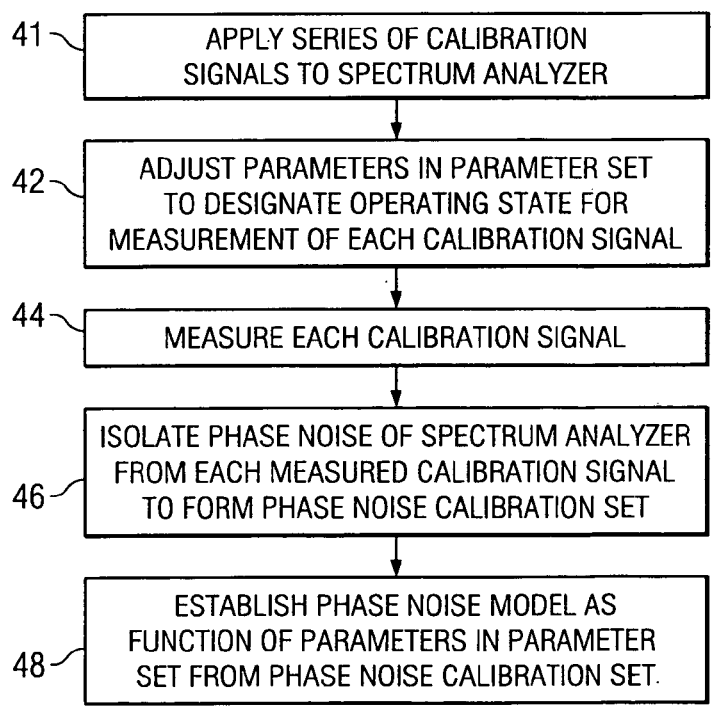
FIG. 4 shows a flow diagram for establishing a phase noise model according to embodiments of the present invention.

FIG. 4 shows a flow diagram 40 for establishing the phase noise model $\mathscr{L}(f_{OFFSET})$, which includes applying a series of calibration signals $S1_{CAL} \ldots SN_{CAL}$ to the spectrum analyzer 10 (step 41). The calibration signals $S1_{CAL} \ldots SN_{CAL}$ stimulate the spectrum analyzer 10 at a sufficient number of frequencies or other stimulus conditions to enable the phase noise $\phi_{SA}$ of the spectrum analyzer 10 to be represented at predetermined frequency offsets $f_{OFFSET}$ and at the various parameter settings that designate the operating states of the spectrum analyzer 10.

In step 42 of the flow diagram 40, the parameters in the parameter set 13 are adjusted to settings $\{f_{OFFSET}, f_{SIF}, P, N, R\}_{CAL}$ that designate corresponding operating states of the spectrum analyzer for the measurement of each of the calibration signals $S1_{CAL} \ldots SN_{CAL}$. Step 44 includes measuring each of the calibration signals $S1_{CAL} \ldots SN_{CAL}$ at the center frequency CF, frequency span SPAN and resolution bandwidth RBW determined by the operating state designated by the settings $\{f_{OFFSET}, f_{SIF}, P, N, R\}_{CAL}$ of the parameters in the parameter set 13. The phase noise $\phi_{SA}$ of the spectrum analyzer 10 at predetermined frequency offsets $f_{OFFSET}$ from the measured calibration signals is isolated in step 46 to form a phase noise calibration set $\phi_{CAL}\{f_{OFFSET}, f_{SIF}, P, N, R\}_{CAL}$, which is a function of the parameters in the parameter set 13 adjusted to the settings $\{f_{OFFSET}, f_{SIF}, P, N, R\}_{CAL}$. The calibration signals $S1_{CAL} \ldots SN_{CAL}$ applied to the spectrum analyzer have substantially lower phase noise than the spectrum analyzer 10, so that the phase noise of each measured calibration signal is attributed to the spectrum analyzer 10. Alternatively, the phase noise of the calibration signals $S1_{CAL} \ldots SN_{CAL}$ has low uncertainty, so that the phase noise $\phi_{SA}$ of the spectrum analyzer 10 can be isolated by subtracting, on a linear power scale, the phase noise of the calibration signals from the total phase noise that is measured by the spectrum analyzer, where the subtraction is performed at the frequency offsets $f_{OFFSET}$.

Step 48 includes establishing the phase noise model $\mathscr{L}(f_{OFFSET})$ as a set of functions F of the frequency offsets $f_{OFFSET}$ and the parameters in the parameter set 13. When the parameter set includes the exemplary parameters of table 1, the phase noise model is expressed as $\mathscr{L}(f_{OFFSET})=F\{f_{OFFSET}, f_{SIF}, P, N, R\}$. The functions F include a series of contours, typically represented by coefficients, polynomial terms, of elements in an array or look-up table, which result from curve fitting or other mappings of phase noise at frequency offsets $f_{OFFSET}$ to the phase noise calibration set $\phi_{CAL}\{f_{OFFSET}, f_{SIF}, P, N, R\}$CAL established in step 46.

In one example, the set of functions F are linear, wherein each function Fx within the set of functions F has a slope m that is a function of the sampler IF polarity P, the sampler harmonic number N and the PLL divide ratio R. Each function Fx also has an offset b that is a function of the sampler IF polarity P, the sampler harmonic number N and PLL divide ratio R. The linear relationship for the modeled phase noise of the spectrum analyzer 10 and sampler IF frequency $f_{SIF}$ for each setting or adjustment of the sampler IF polarity P, the sampler harmonic number N and the PLL divide ratio R, at the offset frequency $f_{OFFSET}$, is expressed as $\mathscr{L}(f_{OFFSET})=m(f_{OFFSET}, P, N, R)f_{SIF}+b\{f_{OFFSET}, P, N, R\}$ The phase noise model $\mathscr{L}(f_{OFFSET})$ provides a mapping or correspondence between phase noise $\phi_{SA}$ of the spectrum analyzer 10 at frequency offsets $f_{OFFSET}$, and settings of the parameters in the parameter set 13. Thus, for a given operating state of the spectrum analyzer 10 that is designated by the parameters, the phase noise $\phi_{SA}$ of the spectrum analyzer 10 can be determined from the phase noise model $\mathscr{L}(f_{OFFSET})$. Typically, the phase noise model $\mathscr{L}(f_{OFFSET})$ is stored in a memory or other storage medium (not shown) that is accessible to the controller 14.

Referring again to FIGS. 2 and 3, once the phase noise model $\mathscr{L}(f_{OFFSET})$ is established, applied signals are subsequently measured by the spectrum analyzer 10. For example, the measurement acquisition unit 18 receives the signal $S_{IN}$ and acquires a phase noise measurement $S_{MEAS}$ for the applied signal $S_{IN}$. The phase noise measurement $S_{MEAS}$, typically stored in a display memory 26, is acquired at an operating state that includes a designated setting of the center frequency CF, frequency span SPAN, number of measurement points n, resolution bandwidth RBW and frequency offset from the carrier frequency $f_{CO}$. The computational unit 20 forms an array D 24 for the applied signal $S_{IN}$ from the phase noise model $\mathscr{L}(f_{OFFSET})$ 22 based on the frequency span SPAN, number of measurement points n and the frequency offset $f_{CO}$.

Figure 5A:
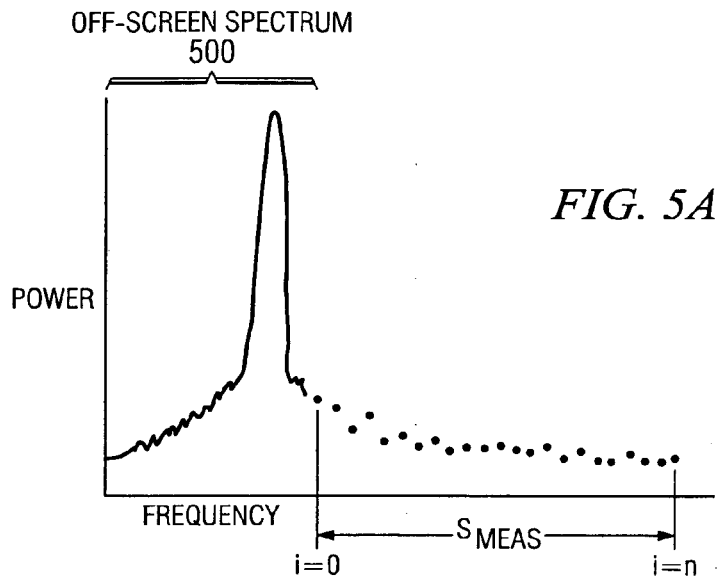
FIGS. 5A–5B show exemplary signals relevant to the embodiments of the present invention.
Figure 5B:
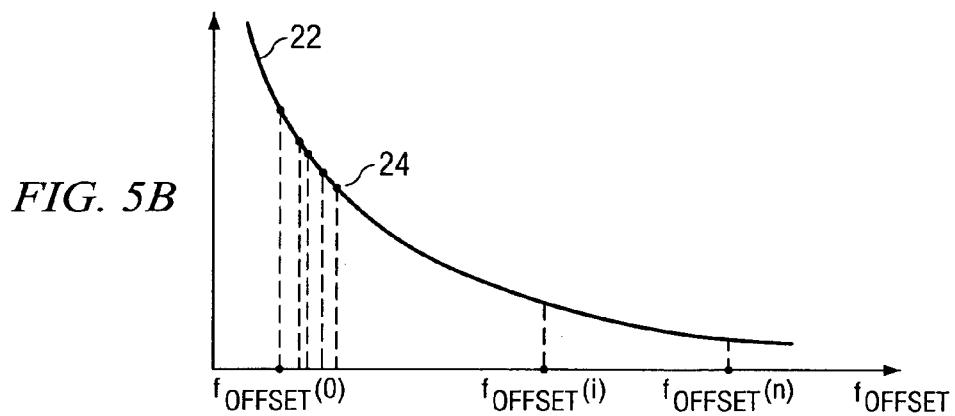

FIGS. 5A and 5B show exemplary signals relevant to the embodiments of the present invention. As shown in FIG. 5A, a phase noise measurement trace $S_{MEAS}$ for a continuous wave signal at a designated operating state of the spectrum analyzer has a predetermined number of measurement points, designated by integer index i. For ease of understanding, the carrier frequency of the full continuous wave signal is shown as part of an off-screen spectrum 500.

The phase noise model $\mathscr{L}(f_{OFFSET})$ 22 for the applied signal $S_{IN}$ is shown in FIG. 5B. The array D 24 includes selected points in the phase noise model 22, designated by the index i. The first selected point in array D 24 corresponds to the frequency at which i=0 in FIG. 5A, and is shown in FIG. 5B as the phase noise value at the frequency offset $f_{OFFSET}(0)$. Each point in the array D 24 has a corresponding value Di, established from the phase noise model $\mathscr{L}(f_{OFFSET})$22 evaluated at offset frequencies $f_{OFFSET}=f_{OFFSET}(0)+i(\text{SPAN}/n)$. The array D applied to the signal processor 30 in FIG. 2 comprises a set of values Di that are power ratios expressed on a linear scale. For an array D having n points, Di can be expressed as:

$$Di = NBW * 10^{0.1 * \mathscr{L}_{OFFSET}(i)} \quad (2)$$

In equation 2, the term NBW represents the noise bandwidth of the spectrum analyzer 10 (shown in FIG. 3).

Referring again to FIG. 2, the signal processor 30 applies the array D to the measurement trace $S_{MEAS}$ to extract the output signal $S_{OUT}$. Applying the array D typically includes a multiplication of the power of the carrier frequency $A_C$ with the array D, and a subtraction of the resulting product $A_C*D$ from the measurement trace $S_{MEAS}$. The measurement trace $S_{MEAS}$ and the array D are each expressed on a linear power scale for processing by the signal processor 30. The output signal $S_{OUT}$ provided by the signal processor 30 as a result of applying the array D to the measurement trace $S_{MEAS}$ is expressed in equation 3.

$$S_{OUT} = S_{MEAS} - A_C*D \quad (3)$$

Since the array D provides an estimate of the phase noise $\phi_{SA}$ of the spectrum analyzer 10 at the designated operating state, the array D is approximately equal to the phase noise $\phi_{SA}$ of the spectrum analyzer 10. Thus, the resulting output signal $S_{OUT}$ is a representation of the phase noise of the signal $S_{IN}$ that includes compensation to reduce the influence of the phase noise $\phi_{SA}$ of the spectrum analyzer 10.

Figure 6:
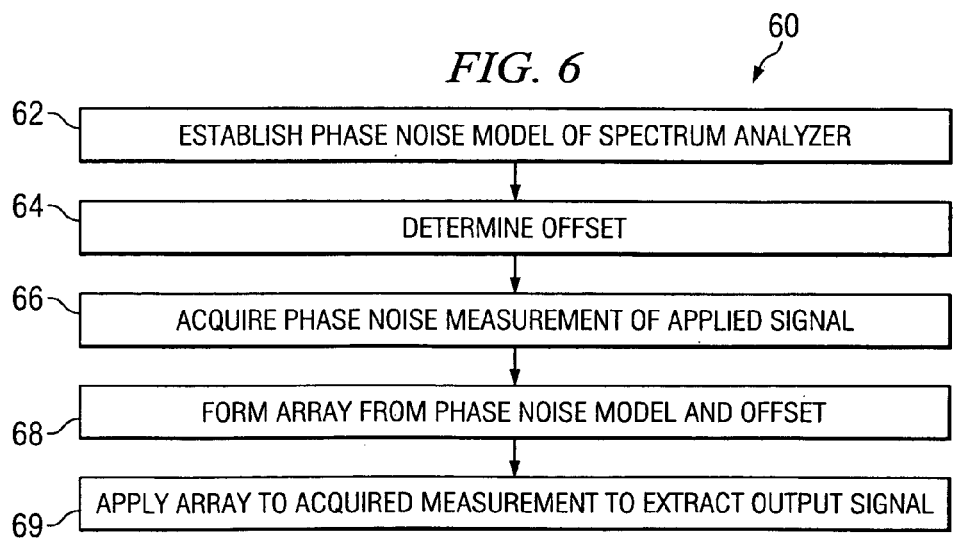
FIG. 6 shows a flow diagram of a phase noise compensation method according to embodiments of the present invention.

FIG. 6 shows a flow diagram of a phase noise compensation method 60 according to embodiments of the present invention. Step 62 includes establishing the phase noise model for the spectrum analyzer. This step in the phase noise compensation method 60 typically includes applying the series of calibration signals $S1_{CAL} \ldots SN_{CAL}$ to the spectrum analyzer 10, and adjusting the parameters in the parameter set 13 to the settings $\{f_{OFFSET}, f_{SIF}, P, N, R\}_{CAL}$ to designate corresponding operating states of the spectrum analyzer for the measurement of each of the calibration signals $S1_{CAL} \ldots SN_{CAL}$. Each of the calibration signals $S1_{CAL} \ldots SN_{CAL}$ is then measured at the center frequency CF, frequency span SPAN and resolution bandwidth RBW determined by the designated operating state. Then, the phase noise $\phi_{SA}$ of the spectrum analyzer 10 is isolated at predetermined frequency offsets $f_{OFFSET}$ from the measured calibration signal to form the phase noise calibration set $\phi_{CAL}\{f_{OFFSET}, f_{SIF}, P, N, R\}_{CAL}$, when the parameter set 13 includes the parameters of table 1. Then, the phase noise model $\mathcal{L}(f_{OFFSET})$ is established as the set of functions F, of the frequency offsets $f_{OFFSET}$ and the parameters in the parameter set 13.

In step 64, the frequency offset from the carrier frequency to the beginning of the frequency range of the phase noise for which phase noise measurements are to be taken is determined. The frequency offset can be positive or negative depending on the phase noise sideband of interest with positive offsets representing upper sidebands and negative offsets representing lower sidebands. For example, to measure the phase noise of an applied signal between 1 and 3 kilohertz offset from the carrier frequency, the frequency offset is set to 1 kilohertz.

In step 66, a trace $S_{MEAS}$, including an array phase noise measurement points, is acquired by the measurement acquisition unit 18 of the spectrum analyzer in response to the signal $S_{IN}$ applied to the spectrum analyzer 10.

In step 68, the array D is formed from the phase noise model, based on the operating state of the spectrum analyzer 10 designated by the parameter set 13, including, for example, the frequency span SPAN, the number of measurement points n in $S_{MEAS}$ and the desired frequency offset from the carrier frequency $f_{CO}$. While step 66 is shown proceeding step 68, the array D can be formed before or after the acquisition of $S_{MEAS}$.

Step 69 includes applying the array D to the phase noise measurements $S_{MEAS}$ to extract the output signal $S_{OUT}$. This typically includes a multiplication of the power of the carrier frequency $A_C$ with the array D and then a subtraction of the resulting product from the phase noise measurements $S_{MEAS}$, where the phase noise measurements $S_{MEAS}$ and the array D are each expressed on a linear power scale.

As will be recognized by those skilled in the art, the innovative concepts described in the present application can be modified and varied over a wide rage of applications. Accordingly, the scope of patents subject matter should not be limited to any of the specific exemplary teachings discussed, but is instead defined by the following claims.

I claim:

1. A method comprising:
   establishing a phase noise model of a spectrum analyzer at a series of operating states;
   determining a carrier frequency associated with a phase noise measurement signal;
   determining an offset from the carrier frequency of the phase noise measurement signal;
   forming an array from the phase noise model based on a designated operating state of the spectrum analyzer and the offset; and
   applying the array to a phase noise measurement signal acquired by the spectrum analyzer at the designated operating state to extract an output signal.

2. The method of claim 1, wherein establishing the phase noise model includes applying a series of calibration signals to the spectrum analyzer, designating a corresponding operating state of the spectrum analyzer for measuring each of the calibration signals in the series, and isolating the phase noise of the spectrum analyzer from the measured calibration signals.

3. The method of claim 2, wherein applying the array includes multiplying the array with the power of the carrier frequency to form a product, and subtracting from the phase noise measurement signal the product.

4. The method of claim 2, wherein forming the array includes establishing a set of values from the phase noise model according to a frequency span of an applied signal from which the phase noise measurement signal is obtained, a number of measurement points in the phase noise measurement signal and the offset.

5. The method of claim 1, wherein applying the array includes multiplying the array with the power of the carrier frequency to form a product, and subtracting from the phase noise measurement signal the product.

6. The method of claim 5, wherein forming the array includes establishing a set of values from the phase noise model according to a frequency span of an applied signal from which the phase noise measurement signal is obtained, a number of measurement points in the phase noise measurement signal and the offset.

7. The method of claim 1, wherein forming the array includes establishing a set of values from the phase noise model according to a frequency span of an applied signal from which the phase noise measurement signal is obtained, a number of measurement points in the phase noise measurement signal and the offset.

8. The method of claim 1, wherein the series of operating states of the spectrum analyzer and the designated operating state are designated by a parameter set.

9. The method of claim 8, wherein the phase noise model includes a set of functions of the parameter set.

10. The method of claim 1, wherein the phase noise model includes a set of functions of a parameter set that designates the series of operating states of the spectrum analyzer and the designated operating state.

11. A system, comprising:
    a computational unit connected to receive a set of parameters and to form an array from a phase noise model of a spectrum analyzer at a series of operating states that each are dependent on a respective parameter set, said array being formed based on a designated operating state and an offset from a carrier frequency associated with a phase noise measurement signal acquired by the spectrum analyzer; and
    a signal processor connected to receive the phase noise measurement signal acquired by the spectrum analyzer at the designated operating state and to apply the array to the phase noise measurement signal to extract an output signal.

12. The system of claim 11, wherein the phase noise model depends on the parameter set and a calibration set.

13. The system of claim 12, wherein the calibration set is based on applying a series of calibration signals to the spectrum analyzer, designating a corresponding operating state of the spectrum analyzer for measuring each of the calibration signals in the series of calibration signals, and isolating the phase noise of the spectrum analyzer from corresponding measurements of the calibration signals.

14. The system of claim 12, wherein the signal processor multiplies the array with the power of the carrier frequency of the designated operating state to form a product, and subtracts from the phase noise measurement signal the product.

15. The system of claim 13, wherein the computational unit forms the array by establishing a set of values from the phase noise model according to a frequency span of an applied signal from which the phase noise measurement signal is obtained, a number of measurement points in the phase noise measurement signal and the offset.

16. The system of claim 11, wherein the parameter set includes a sampler intermediate frequency, a sampler intermediate frequency polarity, a sampler harmonic number and a phase lock loop divide ratio.

17. The system of claim 16, wherein the calibration set is based on applying a series of calibration signals to the spectrum analyzer, designating a corresponding operating state of the spectrum analyzer for measuring each of the calibration signals in the series of calibration signals, and isolating the phase noise of the spectrum analyzer from corresponding measurements of the calibration signals.

18. The system of claim 16, wherein the signal processor multiplies the array with the power of the carrier frequency of the designated operating state to form a product, and subtracts from the phase noise measurement signal the product.

19. The system of claim 17, wherein the computational unit forms the array by establishing a set of values from the phase noise model according to a frequency span of an applied signal from which the phase noise measurement signal is obtained, a number of measurement points in the phase noise measurement signal and the offset.

20. The system of claim 11, wherein the signal processor multiplies the array with the power of the carrier frequency of the designated operating state to form a product, and subtracts from the phase noise measurement signal the product.

* * * * *